(12) United States Patent
Sun et al.

(10) Patent No.: US 10,985,348 B2
(45) Date of Patent: Apr. 20, 2021

(54) DISPLAY PANEL, MANUFACTURING METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Kuo Sun, Beijing (CN); Mingche Hsieh, Beijing (CN); Yang Wang, Beijing (CN); Xing Fan, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 0 days.

(21) Appl. No.: 16/233,837

(22) Filed: Dec. 27, 2018

(65) Prior Publication Data
US 2019/0221782 A1    Jul. 18, 2019

(30) Foreign Application Priority Data
Jan. 12, 2018    (CN) .......................... 201810032556.7

(51) Int. Cl.
*H01L 51/56* (2006.01)
*H01L 51/00* (2006.01)
(Continued)

(52) U.S. Cl.
CPC .......... *H01L 51/56* (2013.01); *H01L 51/0097* (2013.01); *H01L 51/5012* (2013.01);
(Continued)

(58) Field of Classification Search
CPC . H01L 51/56; H01L 51/0097; H01L 51/5012; H01L 51/5209; H01L 51/5225;
(Continued)

(56) References Cited

U.S. PATENT DOCUMENTS

2017/0123452 A1* 5/2017 Evans, V .............. G06F 1/1686
2017/0154566 A1* 6/2017 Ryoo ........................ G02F 1/13
(Continued)

FOREIGN PATENT DOCUMENTS

| CN | 206116384 U | 4/2017 |
|----|-------------|--------|
| CN | 106711183 A | 5/2017 |

(Continued)

OTHER PUBLICATIONS

First Office Action for Chinese Application No. 201810032556.7, dated Aug. 31, 2020, 10 Pages.
(Continued)

*Primary Examiner* — Peter Bradford
(74) *Attorney, Agent, or Firm* — Brooks Kushman P.C.

(57) ABSTRACT

A display panel, a manufacturing method thereof and a display device are provided. The display panel includes a plurality of functional layers arranged on a base substrate. A portion of at least one of the functional layers is removed to form a gap portion. The display panel further includes a light-transmissible structure including the gap portion and configured to allow a light beam to pass therethrough to an optical sensing element arranged at a position corresponding to the light-transmissible structure. An orthogonal projection of the gap portion onto the base substrate overlaps an orthogonal projection of the optical sensing element onto the base substrate.

9 Claims, 4 Drawing Sheets

(51) Int. Cl.
*H01L 51/50* (2006.01)
*H01L 51/52* (2006.01)
*H01L 27/32* (2006.01)

(52) U.S. Cl.
CPC ...... *H01L 51/5209* (2013.01); *H01L 51/5225* (2013.01); *H01L 27/3276* (2013.01); *H01L 51/0017* (2013.01); *H01L 51/0023* (2013.01)

(58) Field of Classification Search
CPC ............ H01L 27/3276; H01L 51/0017; H01L 51/0023
See application file for complete search history.

(56) References Cited

U.S. PATENT DOCUMENTS

| | | | | |
|---|---|---|---|---|
| 2017/0162111 A1* | 6/2017 | Kang | .................. | H01L 27/3276 |
| 2018/0095582 A1* | 4/2018 | Hwang | ............... | H01L 27/3276 |
| 2018/0120987 A1* | 5/2018 | Kim | ...................... | G06F 3/0443 |
| 2018/0196475 A1* | 7/2018 | Bao | .................. | G02F 1/134309 |
| 2018/0269397 A1* | 9/2018 | Xin | ....................... | H01L 51/001 |
| 2019/0051670 A1* | 2/2019 | Bei | .......................... | G09G 3/20 |
| 2019/0101779 A1* | 4/2019 | Peng | .................... | G02F 1/13318 |
| 2019/0130822 A1* | 5/2019 | Jung | ................... | H01L 27/3234 |
| 2019/0319202 A1 | 10/2019 | Dang et al. | | |
| 2020/0020892 A1* | 1/2020 | Kishimoto | ............. | H05B 33/10 |

FOREIGN PATENT DOCUMENTS

| | | |
|---|---|---|
| CN | 206322700 U | 7/2017 |
| CN | 107195795 A | 9/2017 |
| CN | 206497892 U | 9/2017 |

OTHER PUBLICATIONS

1$^{st}$ Chinese Office Action, English Translation.
CN106711183A, English Abstract and Machine Translation.
CN107195795A, English Abstract and Machine Translation.
CN206116384U, English Abstract and Machine Translation.
CN206322700U, English Abstract and U.S. Equivalent U.S. Pub. No. 2019/0319202.
CN206497892U, English Abstract and Machine Translation.

* cited by examiner

DISPLAY PANEL, MANUFACTURING METHOD THEREOF, AND DISPLAY DEVICE

CROSS-REFERENCE TO RELATED APPLICATION

This application claims priority to Chinese Patent Application No. 201810032556.7 filed on Jan. 12, 2018, which is incorporated herein by reference in its entirety.

TECHNICAL FIELD

The present disclosure relates to the field of the display technology, in particular to a display panel, a manufacturing method thereof, and a display device.

BACKGROUND

Internal space utilization of a smart phone increases along with the development of the industrial design and manufacture process and a size of the smart phone also increases. Currently, customers are focusing on a compact body while a large-size screen is provided. Due to hardware homogeneity, "screen-to-body ratio" has become a very hot phrase for the smart phone.

At first, it is able for a narrow-bezel smart phone to provide a higher screen-to-body ratio, i.e., provide a large display panel even when it has a small body size, thereby to improve the user experience in terms of videos and games, as well as the portability. In addition, it is able for the narrow-bezel smart phone to provide an optimum visual effect, i.e., provide a larger screen for a fixed body size or provide a small body for a fixed screen size.

Usually, the smart phone is equipped with a front-facing camera for a selfie, so it is necessary to provide a certain space at a bezel of the smart phone for the front-facing camera. However, for the smart phone with a large screen, there is an urgent need to provide a scheme for increasing the screen-to-body ratio.

SUMMARY

An object of the present disclosure is to provide a display panel, a manufacturing method thereof, and a display device.

In one aspect, the present disclosure provides in some embodiments a display panel, including a plurality of functional layers arranged on a base substrate. At least one of the functional layers includes a gap portion. The display panel further includes a light-transmissible structure including the gap portion and configured to allow a light beam to pass therethrough to an optical sensing element arranged at a position corresponding to the light-transmissible structure. An orthogonal projection of the gap portion onto the base substrate at least partially overlaps an orthogonal projection of the optical sensing element onto the base substrate.

In a possible embodiment of the present disclosure, the gap portion is a groove or a hollowed-out structure.

In a possible embodiment of the present disclosure, the display panel further includes a planarization layer arranged on the base substrate, and an organic electroluminescent structure arranged on the planarization layer. The organic electroluminescent structure includes an anode, a light-emitting layer and a cathode laminated one on another sequentially, and at least one of the planarization layer, the anode, the light-emitting layer and the cathode includes the gap portion.

In a possible embodiment of the present disclosure, the display panel further includes a wire layer arranged on the base substrate, and an orthogonal projection of each wire at the wire layer onto the base substrate does not overlap an orthogonal projection of the light-transmissible structure onto the base substrate.

In a possible embodiment of the present disclosure, the base substrate is a flexible base substrate including a single-layered polyimide film or a transparent polyimide film.

In a possible embodiment of the present disclosure, the light-transmissible structure is arranged at a display region of the display panel.

In a possible embodiment of the present disclosure, the light-transmissible structure has a light transmittance greater than a threshold.

In a possible embodiment of the present disclosure, the threshold is 60%.

In a possible embodiment of the present disclosure, the orthogonal projection of the gap portion onto the base substrate coincides with the orthogonal projection of the optical sensing element onto the base substrate.

In another aspect, the present disclosure provides in some embodiments a method for manufacturing a display panel. The display panel includes a plurality of functional layers arranged on a base substrate. The method includes removing a portion of at least one of the functional layers, so as to form a gap portion at the at least one of the functional layers, thereby to form a light-transmissible structure. The light-transmissible structure includes the gap portion and is configured to allow a light beam to pass therethrough to an optical sensing element arranged at a position corresponding to the light-transmissible structure. An orthogonal projection of the gap portion onto the base substrate at least partially overlaps an orthogonal projection of the optical sensing element onto the base substrate.

In a possible embodiment of the present disclosure, the display panel includes a planarization layer arranged on the base substrate, and an organic electroluminescent structure arranged on the planarization layer and including an anode, a light-emitting layer and a cathode laminated one on another sequentially. The method further includes removing a portion of at least one of the planarization layer, the anode, the light-emitting layer and the cathode, so as to form the gap portion.

In a possible embodiment of the present disclosure, the planarization layer is made of a photosensitive material, and the removing a portion of the planarization layer includes: applying a photosensitive material layer onto the base substrate; exposing the photosensitive material layer with a mask plate including a light-transmissible pattern corresponding to the gap portion and an opaque pattern corresponding to the other portions of the light-transmissible structure other than the gap portion; and developing and removing a portion of the photosensitive material layer corresponding to the light-transmissible pattern, so as to form the gap portion.

In a possible embodiment of the present disclosure, the removing a portion of the anode includes: forming an anode material layer on the planarization layer; applying a photoresist onto the anode material layer, exposing the photoresist with a mask plate, and developing the exposed photoresist so as to form a photoresist reserved region and a photoresist unreserved region; and wet etching the anode material layer at the photoresist unreserved region, so as to remove a portion of the anode material layer, thereby to form the gap portion.

In a possible embodiment of the present disclosure, the removing portions of the light-emitting layer and the cathode includes, after the formation of the light-emitting layer and the cathode, shielding other portions of the light-emitting layer and the cathode other than to-be-removed portions with a mask plate, and removing the to-be-removed portions of the light-emitting layer and the cathode through dry-etching so as to form the gap portion.

In a possible embodiment of the present disclosure, a portion of the at least one of the functional layers is removed, so as to form the gap portion at the at least one of the functional layers.

In yet another aspect, the present disclosure provides in some embodiments a display device including the above-mentioned display panel and an optical sensing element arranged at a non-display side of the display panel and arranged opposite to the light-transmissible structure.

In a possible embodiment of the present disclosure, the display device is a flexible display device, and further includes a bottom film layer attached to the non-display side of the display panel and a buffer shielding layer arranged at a side of the bottom film layer distal to the display panel. Each of the bottom film layer and the buffer shielding layer is provided with an opening, an orthogonal projection of the opening onto the display panel overlaps an orthogonal projection of the light-transmissible structure onto the display panel, and the optical sensing element is arranged within the opening.

In a possible embodiment of the present disclosure, the display device is a touch display device, and further includes a touch screen arranged at the display side of the display panel and a polarizer arranged at a side of the touch screen distal to the display panel. A portion of at least one of the touch screen and the polarizer is removed so as to form a gap portion, and an orthogonal projection of the gap portion onto the display panel at least partially overlaps an orthogonal projection of the light-transmissible structure onto the display panel.

In a possible embodiment of the present disclosure, the optical sensing element is a camera.

In a possible embodiment of the present disclosure, the orthogonal projection of the gap portion onto the display panel coincides with the orthogonal projection of the light-transmissible structure onto the display panel.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
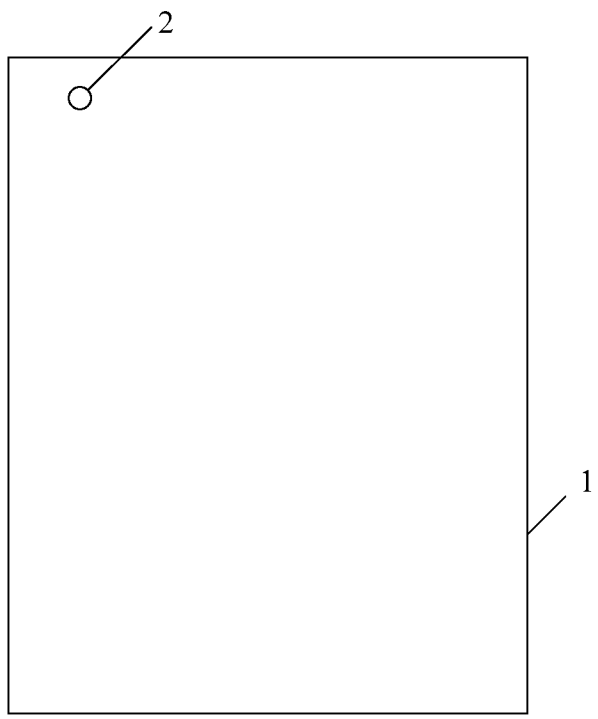
FIG. 1 is a planar view of a display panel according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

An object of the present disclosure is to provide a display panel, a manufacturing method thereof and a display device, so as to increase a screen-to-body ratio of the display device, and optimize a display effect of the display device.

The present disclosure provides in some embodiments a display panel including a plurality of functional layers. A portion of at least one of the functional layers is removed so as to form a gap portion. The display panel further includes a light-transmissible structure which includes the gap portion and has a light transmittance greater than a threshold. The light-transmissible structure is configured to allow a light beam to pass therethrough to an optical sensing element at a position corresponding to the light-transmissible structure. An orthogonal projection of the gap portion onto the base substrate overlaps an orthogonal projection of the optical sensing element onto the base substrate.

The gap portion may be a groove or a hollowed-out structure. It should be appreciated that, a magnitude of a size of the gap portion is greatly different from that of a via-hole in a display panel in related art for connecting a signal line and an electrode, and the size of the gap portion may be at a millimeter level. The light-transmissible structure may include the gap portion and any other functional layers at a position corresponding to the gap portion, or it may merely include the gap portion.

According to the embodiments of the present disclosure, at least one of the functional layers of the display panel includes the gap portion, so as to form on the display panel the light-transmissible structure having the light transmittance greater than the threshold and being capable of allowing the light beam to pass therethrough to the optical sensing element at the position corresponding to the light-transmissible structure. Hence, it is unnecessary to provide the optical sensing element at a bezel of a display device, and instead, it is able to provide the optical sensing element at a non-display side of the display panel. The optical sensing element may receive an external light beam through the light-transmissible structure, and it is unnecessary to provide a space at the bezel of the display device for the optical sensing element. As a result, it is able to increase a screen-to-body ratio of the display device, and optimize a display effect of the display device.

In a possible embodiment of the present disclosure, the display panel is an organic light-emitting diode (OLED) display panel which includes a base substrate, a planarization layer arranged on the base substrate, an organic electroluminescent structure arranged on the planarization layer, and an encapsulation film covering an outer side of the organic electroluminescent structure. The organic electroluminescent structure includes an anode, a light-emitting layer and a cathode laminated one on another sequentially. At least one of the planarization layer, the anode, the light-emitting layer and the cathode includes the gap portion, and the orthogonal projection of the gap portion onto the base substrate completely overlaps the orthogonal projection of the light-transmissible structure onto the base substrate.

In addition, the display panel further includes a wire layer arranged on the base substrate, and an orthogonal projection of each wire at the wire layer onto the base station does not overlap the orthogonal projection of the light-transmissible structure onto the base substrate.

In addition, the base substrate may be a flexible base substrate or a rigid base substrate. When the base substrate is the flexible base substrate, it may include a single-layered polyimide film or a transparent polyimide film, so as to increase a light transmittance of the base substrate.

In a possible embodiment of the present disclosure, the light-transmissible structure is located at a display region of the display panel, so as to reduce an area of a non-display region of the display panel, thereby to provide a narrow-bezel or even bezel-free display device.

To be specific, the light transmittance of the light-transmissible structure is greater than 60%. At this time, it is able for the optical sensing element to receive sufficient external light beams for the subsequent optical detection. The optical sensing element may be a camera.

The present disclosure further provides in some embodiments a method for manufacturing a display panel. The display panel includes a plurality of functional layers arranged on a base substrate. The method includes removing a portion of at least one of the functional layers, so as to form a gap portion at the at least one of the functional layers, thereby to form a light-transmissible structure having a light transmittance greater than a threshold. The light-transmissible structure includes the gap portion and is configured to allow a light beam to pass therethrough to an optical sensing element arranged at a position corresponding to the light-transmissible structure. An orthogonal projection of the gap portion onto the base substrate overlaps an orthogonal projection of the optical sensing element onto the base substrate.

According to the embodiments of the present disclosure, a portion of at least one of the functional layers of the display panel is removed, so as to form on the display panel the light-transmissible structure having the light transmittance greater than the threshold and being capable of allowing the light beam to pass therethrough to the optical sensing element at the position corresponding to the light-transmissible structure. Hence, it is unnecessary to provide the optical sensing element at a bezel of a display device, and instead, it is able to provide the optical sensing element at a non-display side of the display panel. The optical sensing element may receive an external light beam through the light-transmissible structure, and it is unnecessary to provide a space at the bezel of the display device for the optical sensing element. As a result, it is able to increase a screen-to-body ratio of the display device, and optimize a display effect of the display device.

In a possible embodiment of the present disclosure, the display panel is an OLED display panel which includes a base substrate, a planarization layer arranged on the base substrate, an organic electroluminescent structure arranged on the planarization layer, and an encapsulation film covering an outer side of the organic electroluminescent structure. The organic electroluminescent structure includes an anode, a light-emitting layer and a cathode laminated one on another sequentially. To be specific, a portion of at least one of the planarization layer, the anode, the light-emitting layer and the cathode may be removed, so as to ensure that the light transmittance of the light-transmissible structure is greater than the threshold. The method further includes removing a portion of at least one of the planarization layer, the anode, the light-emitting layer and the cathode, so as to form the gap portion. The orthogonal projection of the gap portion onto the base substrate completely overlaps an orthogonal projection of the light-transmissible structure onto the base substrate.

In a possible embodiment of the present disclosure, the planarization layer may be made of a photosensitive material, and a portion of the planarization layer may be removed through an exposing process. To be specific, the removing a portion of the planarization layer includes: applying a photosensitive material layer onto the base substrate with the wire layer; exposing the photosensitive material layer with a mask plate including a light-transmissible pattern corresponding to the gap portion and an opaque pattern corresponding to the other portions; and developing and removing a portion of the photosensitive material layer corresponding to the light-transmissible pattern, so as to form the gap portion. The orthogonal projection of the gap portion onto the base substrate overlaps the orthogonal projection of the light-transmissible structure onto the base substrate.

In a possible embodiment of the present disclosure, a portion of the anode may be removed through a wet etching process. The removing a portion of the anode includes: forming an anode material layer on the planarization layer; applying a photoresist onto the anode material layer, exposing the photoresist with a mask plate, and developing the exposed photoresist so as to form a photoresist reserved region and a photoresist unreserved region; and wet etching the anode material layer at the photoresist unreserved region, so as to remove a portion of the anode material layer, thereby to form the gap portion.

In a possible embodiment of the present disclosure, after the formation of the light-emitting layer and the cathode through evaporation, portions of the light-emitting layer and the cathode may be removed through a dry etching process. The removing portions of the light-emitting layer and the cathode includes, after the formation of the light-emitting layer and the cathode, shielding portions of the light-emitting layer and the cathode other than to-be-removed portions with a mask plate, and removing the to-be-removed portions of the light-emitting layer and the cathode through dry-etching so as to form the gap portion. The orthogonal projection of the gap portion onto the base substrate overlaps the orthogonal projection of the light-transmissible structure onto the base substrate.

During the exposing process, water and oxygen may be introduced. In order to prevent the performance of a display substrate from being adversely affected, when the light-emitting layer and the cathode are being etched, no photoresist may be applied onto the light-emitting layer and the cathode, and instead, the light-emitting layer and the cathode may be shielded by the mask plate. Portions of the light-emitting layer and the cathode may be removed through dry etching, e.g., plasma etching, in a vacuum environment, e.g., a vacuum chamber. A light transmittance of the cathode is smaller than a light transmittance of the light-emitting layer, so merely a portion of the cathode corresponding to the light-transmissible structure or both portions of the light-emitting layer and the cathode corresponding to the light-transmissible structure may be removed.

The present disclosure further provides in some embodiments a display device including the above-mentioned display panel and an optical sensing element arranged at a non-display side of the display panel and arranged opposite to the light-transmissible structure.

According to the embodiments of the present disclosure, at least one of the functional layers of the display panel includes the gap portion, so as to form on the display panel the light-transmissible structure having the light transmittance greater than the threshold and being capable of allowing the light beam to pass therethrough to the optical sensing element at the position corresponding to the light-transmissible structure. Hence, it is unnecessary to provide the optical sensing element at a bezel of a display device, and instead, it is able to provide the optical sensing element at a non-display side of the display panel and opposite to the light-transmissible structure. The optical sensing element may receive an external light beam through the light-transmissible structure, and it is unnecessary to provide a space at the bezel of the display device for the optical sensing element. As a result, it is able to increase a screen-to-body ratio of the display device, and optimize a display effect of the display device.

The display device may be any product or member having a display function, e.g., television, display, digital photo frame, mobile phone or flat-panel computer. The display device may further include a flexible circuit board, a printed circuit board and a back plate.

When the display device is a flexible display device, it may further include a bottom film layer attached to the non-display side of the display panel and a buffer shielding layer arranged at a side of the bottom film layer distal to the display panel. Each of the bottom film layer and the buffer shielding layer may be provided with an opening, and an orthogonal projection of the opening onto the display panel may overlap an orthogonal projection of the light-transmissible structure onto the display panel, so as to prevent the bottom film layer and the buffer shielding layer from blocking the light beams to be transmitted through the light-transmissible structure. The optical sensing element may be arranged within the openings.

When the display device is a touch display device, it may further include a touch screen arranged at the display side of the display panel and a polarizer arranged at a side of the touch screen distal to the display panel. A portion of at least one of the touch screen and the polarizer may be removed so as to form a gap portion, and an orthogonal projection of the gap portion onto the display panel may overlap an orthogonal projection of the light-transmissible structure onto the display panel, so as to prevent the touch screen and the polarizer from blocking the light beams to be transmitted through the light-transmissible structure.

In a possible embodiment of the present disclosure, the optical sensing element may be a camera.

The present disclosure further provides in some embodiments a method for manufacturing a display device which includes, after the manufacture of the display panel through the above-mentioned method, forming an optical sensing element opposite to the light-transmissible structure at the non-display side of the display panel.

When the display device is a flexible display device, it may further include a bottom film layer attached to the non-display side of the display panel and a buffer shielding layer arranged at a side of the bottom film layer distal to the display panel. Portions of the bottom film layer and the buffer shielding layer corresponding to the light-transmissible structure may be removed, so as to prevent the bottom film layer and the buffer shielding layer from blocking the light beams to be transmitted through the light-transmissible structure.

When the display device is a touch display device, it may further include a touch screen arranged at the display side of the display panel and a polarizer arranged at a side of the touch screen distal to the display panel. A portion of at least one of the touch screen and the polarizer corresponding to the light-transmissible structure may be removed, so as to partially prevent the touch screen and the polarizer from blocking the light beams to be transmitted through the light-transmissible structure.

The display device and the manufacturing method thereof will be described hereinafter in more details in conjunction with the drawings by taking an OLED touch display device as an example.

Figure 2:
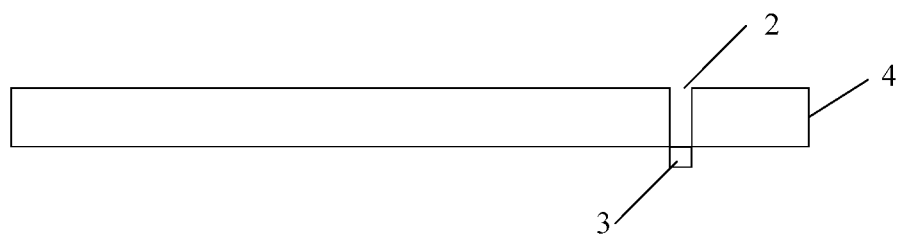
FIG. 2 is a sectional view of the display panel according to one embodiment of the present disclosure.

As shown in FIGS. 1 and 2, the OLED touch display device includes a display panel 4, and an active display region 1 of the display panel 4 is provided with a predetermined region 2 where a light-transmissible structure having a relatively large light transmittance, e.g., greater than 60%, is to be formed. In this way, an optical sensing element 3 may be arranged at a non-display side of the display panel and opposite to the predetermined region. Through the light-transmissible structure, the optical sensing element may receive an external light beam. As a result, it is unnecessary to provide a space at a bezel of the display device for the optical sensing element 3, thereby it is able to increase a screen-to-body ratio of the display device and optimize a display effect of the display device. It should be appreciated that, a size of the light-transmissible structure at the predetermined region 2 shall match a size of the optical sensing element 3, so as to enable the optical sensing element 3 to receive the light beams in a sufficient manner.

Figure 3:
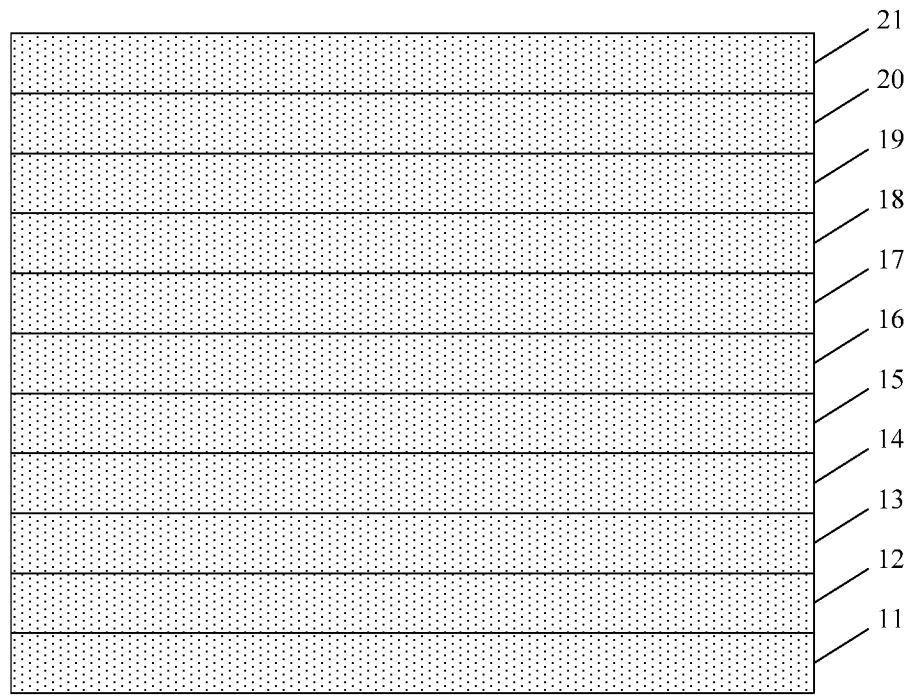
FIG. 3 is a sectional view of a display device according to one embodiment of the present disclosure.

As shown in FIG. 3, the OLED touch display device includes a buffer shielding layer 11, a base substrate 13, a wire layer, a planarization layer 14, an organic electroluminescent structure 15, an encapsulation film 16, an optically clear adhesive 17, a touch screen 18, a polarizer 19, an optically clear adhesive 20 and an encapsulation cover plate 21 arranged sequentially.

The buffer shielding layer 11 is made of materials such as a porous material, a copper foil, graphene and an adhesive tape, so as to achieve such functions as buffering, heat dissipation and shielding. When the OLED touch display device is a flexible display device, it may further include a bottom film layer 12 for support.

A light transmittance of the polarizer 19 is about 43%, a light transmittance of the organic electroluminescent structure 15 is about 50%, a light transmittance of the wire layer and the planarization layer 14 is about 40%, and a light transmittance of the bottom film layer 12 is about 90%. In related art, an OLED touch display device has an overall light transmittance smaller than 10%. When a via-hole is formed in a pixel definition layer of the OLED touch display device, the light transmittance of the organic electroluminescent structure 15 may be increased to about 50%. When a wire at the wire layer and the planarization layer 14 is designed in such a manner as to avoid the predetermined region, the light transmittance of the wire layer and the planarization layer 14 at the predetermined region may be increased to about 70%. At this time, the overall light transmittance of the OLED touch display device at the predetermined region may be increased to about 30%. However, it is still impossible to meet the requirement of the optical sensing element, e.g., a camera, on the light beams.

Figure 4:
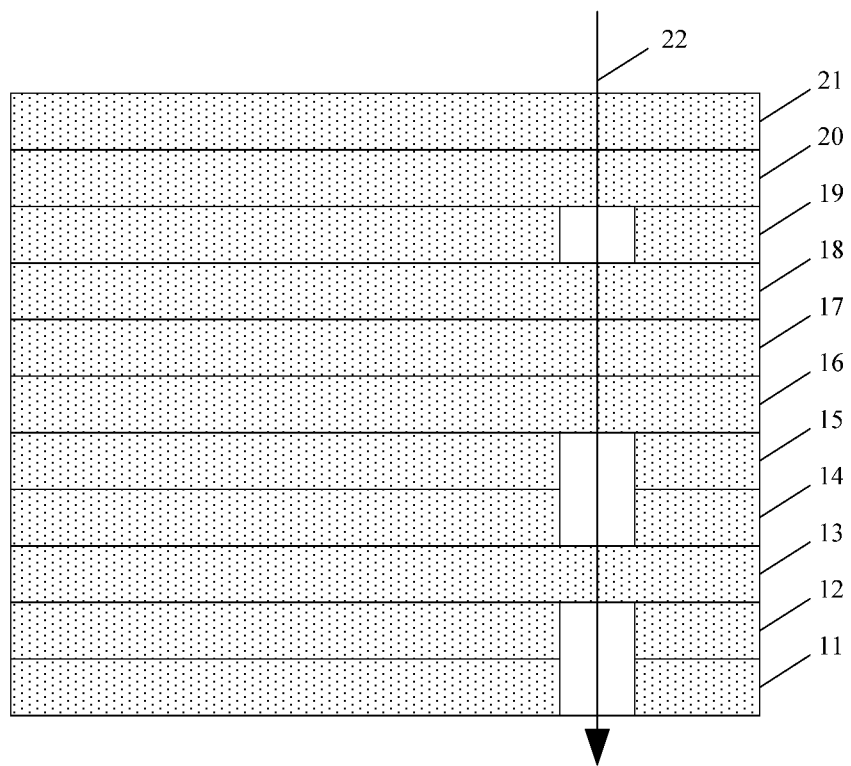
FIG. 4 is a sectional view of a flexible display device according to one embodiment of the present disclosure.
Figure 5:
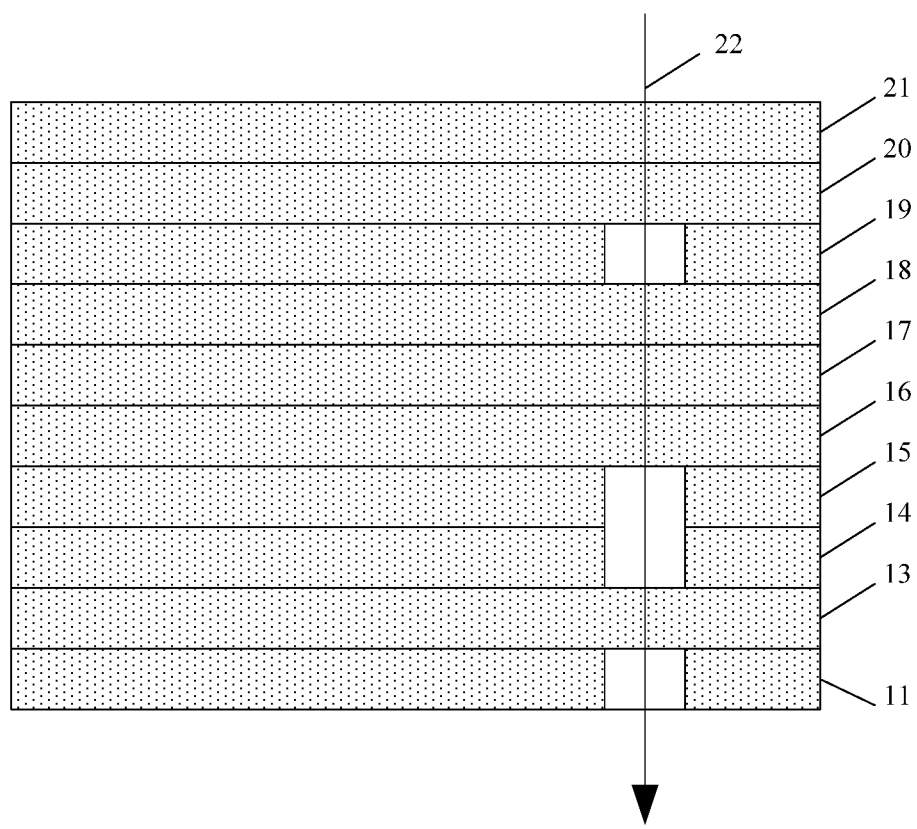
FIG. 5 is a sectional view of a rigid display device according to one embodiment of the present disclosure.
Figure 6:
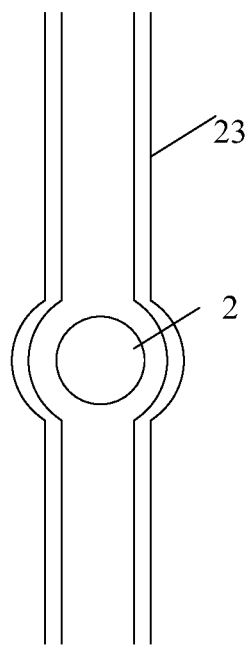
FIG. 6 is a schematic view showing a situation where wires of a wire layer avoid a light-transmissible structure according to one embodiment of the present disclosure.

In order to increase the light transmittance of the OLED touch display device at the predetermined region, as shown in FIGS. 4 and 5, portions of the polarizer 19, the organic electroluminescent structure 15 and the buffer shielding layer 11 at the predetermined region may be removed. In addition, as shown in FIG. 6, the wire 23 at the wire layer and the planarization layer 14 may be designed in such a manner as to avoid the predetermined region 2. As shown in FIG. 4, when the OLED touch display device is a flexible display device, a portion of the bottom film layer 12 at the predetermined region may also be removed. In this way, it is able to increase the light transmittance of the flexible OLED touch display device to be about 60%, and increase the light transmittance of a rigid OLED touch display device to be about 80%, thereby to meet the requirement of the optical sensing element on the light beams 22.

When the optical sensing element is arranged at the non-display side of the OLED touch display device, it is able to reduce a width of the bezel of the OLED touch display device to be about 0.3 mm.

For the flexile OLED touch display device, a portion of the buffer shielding layer 11 at the predetermined region may be removed through plasma etching or punching. A portion of the bottom film layer 12 at the predetermined region may be removed through plasma etching, or the bottom film layer 12 with an opening may be directly formed at the predetermined region. The flexible base substrate of the OLED touch display device may include a single-layered polyimide film or a transparent polyimide film, as compared with the related art where a double-layered polyimide film is adopted, so as to improve the light transmittance of the flexible base substrate. During the formation of the wire at the wire layer, the wire needs to avoid the predetermined region, and a portion of the planarization layer corresponding to the predetermined region may be removed through a patterning process. During the formation of the anode of the OLED touch display device, a portion of the anode corresponding to the predetermined region may be removed while forming an anode pattern. After the formation of the light-emitting layer and the cathode through evaporation, portions of the light-emitting layer and the cathode corresponding to the predetermined region may be removed through dry etching. In order to ensure an encapsulation effect of the OLED touch display device, the encapsulation film 16 may remain as a whole. On the premise that the requirement on the light transmittance has been met, it is unnecessary to remove portions of the touch screen 18 and the polarizer 19 corresponding to the predetermined region. When the requirement on the light transmittance has not been met yet, the portions of the touch screen 18 and the polarizer 19 corresponding to the predetermined region may be removed through plasma etching.

Figure 7:
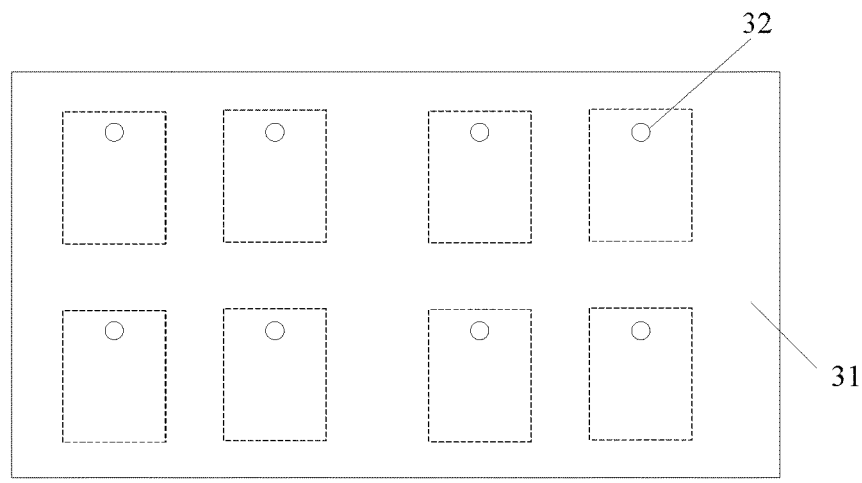
FIG. 7 is a schematic view showing a mask plate according to one embodiment of the present disclosure.
Figure 8:
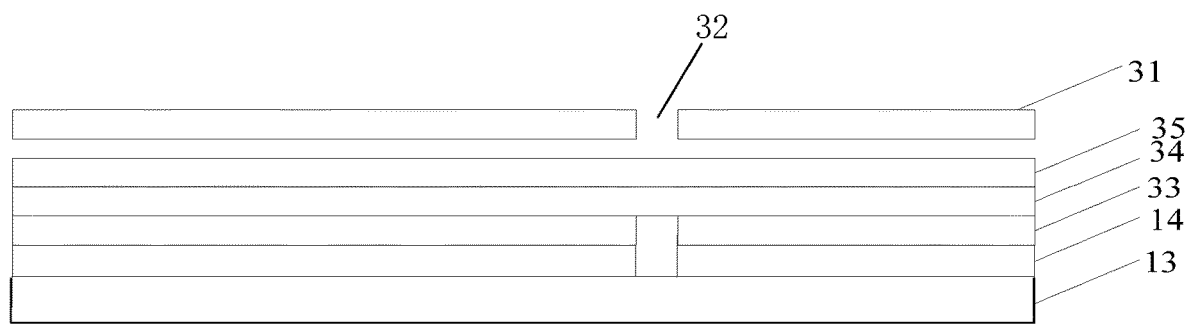
FIGS. 8-9 are schematic views showing the etching of a cathode and a light-emitting layer according to one embodiment of the present disclosure.
Figure 9:
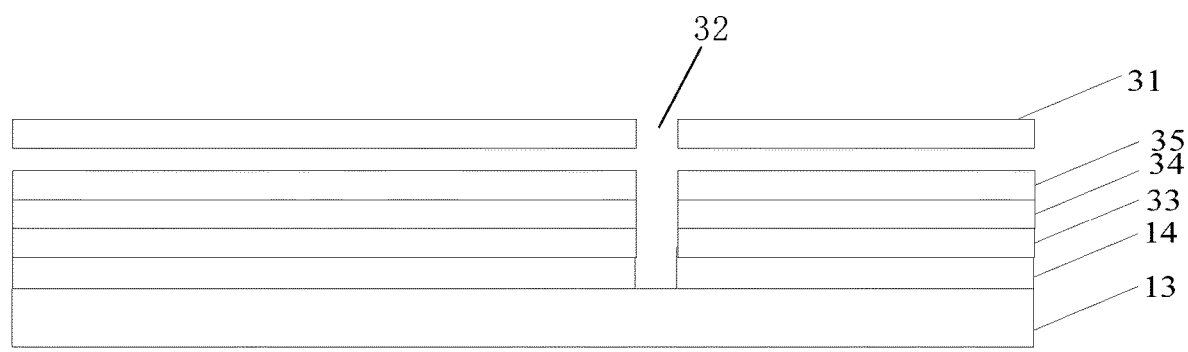

FIG. 7 shows a mask plate 31 adopted for removing the portions of the light-emitting layer and the cathode corresponding to the predetermined region. The mask plate 31 is provided with openings 32 corresponding to the respective predetermined regions. As shown in FIG. 8, after the formation of the light-emitting layer and the cathode through evaporation, the anode 33, the light-emitting layer 34 and the cathode 35 may be formed on the wire layer and the planarization layer 14. The portions of the wire layer, the planarization layer 14 and the anode 33 corresponding to the predetermined region have been removed previously through a patterning process. As shown in FIG. 8, portions of the light-emitting layer 34 and the cathode 35, which do not need to be removed, may be shielded by the mask plate 31, with the opening 32 opposite to the predetermined region. At this time, the portions of the light-emitting layer 34 and the cathode 35 corresponding to the predetermined region may be etched and removed through a plasma etching process, so as to acquire a structure in FIG. 9. As shown in FIG. 9, the portions of the light-emitting layer 34 and the cathode 35 corresponding to the predetermined region have been removed.

During the exposing process, water and oxygen may be introduced. In order to prevent the performance of a display substrate from being adversely affected, when the light-emitting layer and the cathode are being etched, no photoresist may be applied to the light-emitting layer and the cathode. Instead, the light-emitting layer and the cathode may be directly shielded by the mask plate, and then the portions of the light-emitting layer and the cathode may be removed through a dry etching process, e.g., a plasma etching process, in a vacuum chamber.

For a rigid OLED touch display device, the portion of the buffer shielding layer 11 corresponding to the predetermined region may be removed through plasma etching or punching. During the formation of the wire at the wire layer, the wire needs to avoid the predetermined region, and the portion of the planarization layer corresponding to the predetermined region may be removed through a patterning process. During the formation of the anode of the OLED touch display device, the portion of the anode corresponding to the predetermined region may be removed while forming an anode pattern. After the formation of the light-emitting layer and the cathode through evaporation, the portions of the light-emitting layer and the cathode corresponding to the predetermined region may be removed through a dry etching process. In order to ensure the encapsulation effect of the OLED touch display device, the encapsulation film 16 may remain as a whole. On the premise that the requirement on the light transmittance has been met, it is unnecessary to remove the portions of the touch screen 18 and the polarizer 19 corresponding to the predetermined region. When the requirement on the light transmittance has not been met yet, the portions of the touch screen 18 and the polarizer 19 corresponding to the predetermined region may be removed through plasma etching.

FIG. 7 shows the mask plate 13 adopted for removing the portions of the light-emitting layer and the cathode corresponding to the predetermined region. The mask plate 31 is provided with the opening 32 corresponding to the predetermined region. As shown in FIG. 8, after the formation of the light-emitting layer and the cathode through evaporation, the anode 33, the light-emitting layer 34 and the cathode 35 may be formed on the wire layer and the planarization layer 14. The portions of the wire layer, the planarization layer 14 and the anode 33 corresponding to the predetermined region have been removed previously through a patterning process. As shown in FIG. 8, portions of the light-emitting layer 34 and the cathode 35, which do not need to be removed, may be shielded by the mask plate 31, with the opening 32 opposite to the predetermined region. At this time, the portions of the light-emitting layer 34 and the cathode 35 corresponding to the predetermined region may be etched and removed through a plasma etching process, so as to acquire a structure in FIG. 9. As shown in FIG. 9, the portions of the light-emitting layer 34 and the cathode 35 corresponding to the predetermined region have been removed.

During the exposing process, water and oxygen may be introduced. In order to prevent the performance of a display substrate from being adversely affected, when the light-emitting layer and the cathode are etched, no photoresist may be applied to the light-emitting layer and the cathode. Instead, the light-emitting layer and the cathode may be directly shielded by the mask plate, and then the portions of the light-emitting layer and the cathode may be removed through a dry etching process, e.g., a plasma etching process, in a vacuum chamber.

After the encapsulation of the OLED touch display device, the optical sensing element may be attached to the non-display side (i.e., a back surface) of the buffer shielding layer 11 and arranged opposite to the light-transmissible structure. In this way, through the light-transmissible structure at the predetermined region, the optical sensing element may receive the external light beam for the subsequent optical detection.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such word as "including" or "comprising" indicates that an element or unit presented before the word contains elements, units or equivalents presented after the word by enumeration, and it is possible that the element or unit presented before the word further contains other elements or units. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display device, comprising:
   a display panel, wherein the display panel comprises a base substrate, a planarization layer arranged on the base substrate, and an organic electroluminescent structure arranged on the planarization layer, wherein at least the planarization layer comprises a gap portion;
   the display panel further comprises a light-transmissible structure comprising the gap portion, the light-transmissible structure is configured to allow a light beam to pass through the light-transmissible structure and arrive at an optical sensing element arranged at a position corresponding to the light-transmissible structure, and an orthogonal projection of the gap portion onto the base substrate at least partially overlaps an orthogonal projection of the optical sensing element onto the base substrate; and
   the display panel further comprises a wire layer arranged on the base substrate, wherein an orthogonal projection of each wire at the wire layer onto the base substrate does not overlap an orthogonal projection of the light-transmissible structure onto the base substrate; and
   the optical sensing element arranged at a non-display side of the display panel and arranged opposite to the light-transmissible structure;
   wherein the display device is a flexible display device; and
   the display device further comprises: a bottom film layer attached to the non-display side of the display panel, and a buffer shielding layer arranged at a side of the bottom film layer distal to the display panel,
   wherein each of the bottom film layer and the buffer shielding layer is provided with an opening, an orthogonal projection of the opening onto the display panel at least partially overlaps an orthogonal projection of the light-transmissible structure onto the display panel, and the optical sensing element is arranged within the openings.

2. The display device according to claim 1, wherein the optical sensing element is a camera.

3. The display device according to claim 1, wherein the orthogonal projection of the gap portion onto the display panel completely overlaps the orthogonal projection of the light-transmissible structure onto the display panel.

4. The display device according to claim 1, wherein the gap portion is a groove or a hollowed-out structure.

5. The display device according to claim 1, wherein the organic electroluminescent structure comprises an anode, a light-emitting layer and a cathode laminated one on another sequentially, and at least one of the anode, the light-emitting layer and the cathode comprises the gap portion.

6. The display device according to claim 5, wherein the base substrate is a flexible base substrate comprising a single-layered polyimide film or a transparent polyimide film.

7. The display device according to claim 1, wherein the light-transmissible structure is arranged at a display region of the display panel.

8. The display device according to claim 1, wherein a light transmittance of the light-transmissible structure is greater than a threshold, the threshold is a light transmittance of 60%.

9. The display device according to claim 1, wherein the orthogonal projection of the gap portion onto the base substrate completely overlaps the orthogonal projection of the optical sensing element onto the base substrate.

* * * * *